(12) United States Patent
Wu et al.

(10) Patent No.: US 10,993,326 B2
(45) Date of Patent: Apr. 27, 2021

(54) SECURING MECHANISM FOR USE WITH PROCESSOR MODULE

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Heng-Kang Wu, Kunshan (CN); Fu-Jin Peng, Kunshan (CN)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/700,975

(22) Filed: Dec. 2, 2019

(65) Prior Publication Data
US 2020/0178394 A1    Jun. 4, 2020

(30) Foreign Application Priority Data
Nov. 30, 2018    (CN) .......................... 201822006742.1

(51) Int. Cl.
     *H05K 1/00*          (2006.01)
     *H05K 1/18*          (2006.01)
     (Continued)

(52) U.S. Cl.
     CPC .............. *H05K 1/18* (2013.01); *H01L 23/40* (2013.01); *H01R 13/639* (2013.01); *H05K 3/301* (2013.01);
     (Continued)

(58) Field of Classification Search
CPC   H05K 1/18; H05K 3/301; H05K 5/04; H05K 2201/10189; H05K 2201/10393;
(Continued)

(56) References Cited

U.S. PATENT DOCUMENTS 5,170,319 A * 12/1992 Chao-Fan Chu ... H01L 23/4338
                                                         165/170
6,058,014 A *   5/2000   Choudhury ............ H05K 3/325
                                                         257/719

(Continued)

FOREIGN PATENT DOCUMENTS

| CN | 201259939 Y | 6/2009 |
| CN | 201383573 Y | 1/2010 |
| CN | 207459230 U | 6/2018 |

*Primary Examiner* — Abdullah A Riyami
*Assistant Examiner* — Vladimir Imas
(74) *Attorney, Agent, or Firm* — Ming Chieh Chang; Wei Te Chung

(57) ABSTRACT

A securing mechanism for retaining a CPU to an electrical connector mounted upon a top surface of the PCB, includes a fastening device mounted upon the top surface of the PCB beside the electrical connector, and a back plate mounted upon the undersurface of the PCB and located between the PCB and a metallic case. The fastening device cooperates with the back plate to be secured to the PCB via a first set of fixing units. The case forms an opening/recessed region to receive a thickened central region of the back plate and is secured to the back plate via a second set of fixing units surrounding said opening. The thickened central region is fully received within the opening in the vertical direction. The first set of fixing units are located in the central region of the back plate.

19 Claims, 9 Drawing Sheets

(51) Int. Cl.
*H01L 23/40* (2006.01)
*H01R 13/639* (2006.01)
*H05K 5/04* (2006.01)
*H05K 3/30* (2006.01)

(52) U.S. Cl.
CPC ..... *H05K 5/04* (2013.01); *H05K 2201/10189* (2013.01); *H05K 2201/10393* (2013.01); *H05K 2201/2009* (2013.01); *H05K 2203/167* (2013.01)

(58) Field of Classification Search
CPC ..... H05K 2201/2009; H05K 2203/167; H01R 13/639; H01L 23/40
USPC .......................................................... 439/76.1
See application file for complete search history.

(56) References Cited

U.S. PATENT DOCUMENTS

| | | | | |
|---|---|---|---|---|
| 6,116,331 A * | 9/2000 | Tustaniwskyj | ...... | H01L 23/4006 165/185 |
| 6,153,932 A * | 11/2000 | Liang | ................ | H01L 23/3672 257/712 |
| 6,198,630 B1 * | 3/2001 | Cromwell | .......... | H01L 23/4006 165/80.3 |
| 6,679,315 B2 * | 1/2004 | Cosley | ................ | F25B 39/022 165/104.21 |
| 6,809,929 B2 * | 10/2004 | Liu | .................... | H01L 21/4882 165/80.2 |
| 6,930,884 B2 * | 8/2005 | Cromwell | .......... | H01L 23/4093 257/718 |
| 6,992,382 B2 * | 1/2006 | Chrysler | .............. | H01L 23/473 257/706 |
| 7,009,843 B2 * | 3/2006 | Lee | .................... | H01L 23/4093 165/185 |
| 7,106,594 B2 * | 9/2006 | Vetter | ................. | H01L 23/4093 165/80.3 |
| 7,149,087 B2 * | 12/2006 | Wilson | .................. | H01L 23/473 361/699 |
| 7,161,238 B2 * | 1/2007 | Hsieh | ..................... | H01L 23/42 257/704 |
| 7,193,854 B2 * | 3/2007 | Bonomo | ........... | H05K 7/20254 165/80.4 |
| 7,204,701 B1 * | 4/2007 | Balasingham | ....... | H05K 1/0233 361/704 |
| 7,239,516 B2 * | 7/2007 | Long | ................... | H01L 23/4006 257/719 |
| 7,272,006 B2 * | 9/2007 | Mongia | .............. | H01L 23/4006 165/80.4 |
| 7,280,362 B2 * | 10/2007 | Hood | .................. | H01L 23/4093 257/E23.086 |
| 7,285,851 B1 * | 10/2007 | Cepeda-Rizo | ............ | G06F 1/20 257/712 |
| 7,499,279 B2 * | 3/2009 | Campbell | ................ | G06F 1/20 165/80.4 |
| 7,573,359 B2 * | 8/2009 | Kunze | ................. | H05K 1/0218 257/728 |
| 7,864,537 B2 * | 1/2011 | Kim | ..................... | G01R 1/0458 361/719 |
| 7,903,419 B2 * | 3/2011 | Li | ........................... | H01L 23/40 361/719 |
| 7,938,648 B2 * | 5/2011 | Fan | ...................... | H05K 7/1053 439/70 |
| 8,995,933 B2 * | 3/2015 | Waldvogel | ............ | H05K 1/021 455/73 |
| 9,525,448 B2 * | 12/2016 | Hsieh | ................... | H05K 1/0274 |
| 9,646,935 B1 * | 5/2017 | Meyer, IV | ........... | H05K 7/2029 |
| 9,716,051 B2 * | 7/2017 | Zhang | .................. | H01L 23/562 |
| 9,743,558 B2 * | 8/2017 | Bosak | ................. | H05K 7/20336 |
| 10,512,151 B2 * | 12/2019 | Lin | ........................... | H05K 5/03 |
| 2019/0252813 A1 * | 8/2019 | Wu | ....................... | H01R 12/88 |

* cited by examiner

SECURING MECHANISM FOR USE WITH PROCESSOR MODULE

1. FIELD OF THE DISCLOSURE

The invention is related to a processor module securing mechanism, and particularly to the processor module securing mechanism for use with a back plate with a printed circuit board sandwiched therebetween and a metallic case intimately supporting the back plate opposite to the printed circuit board.

2. DESCRIPTION OF RELATED ARTS

China Utility Patent No. CN201259939Y discloses an electronic package, i.e., CPU (Central Processing Unit), loaded into an electrical connector which is mounted upon a printed circuit board (PCB), wherein a metallic cover cooperates, via corresponding screws, with a metallic back plate mounted upon a undersurface of the PCB to hold the CPU in position with regard to the electrical connector. Anyhow, such structure is not fit for the electrical device which has a relatively thin metallic case intimately located under the back plate with very tiny distance between the PCB and the case. For example, the back plate is essentially of 3.2 mm for the required strength thereof while the distance between the case and the PCB is required to be not more than 2.7 mm. An interference may be inevitable under such a situation.

It is desired to provide a new securing mechanism on the top surface of the PCB to hold the CPU in position with regard to the electrical connector, with corresponding fastening devices to cooperate with the back plate wherein the back plate and the relative thin case are arranged not only not to interfere with each other but also to maintain the relative thin case with the required rigidity thereof.

SUMMARY OF THE DISCLOSURE

To achieve the objectives, a securing mechanism for retaining a CPU to an electrical connector mounted upon a top surface of the PCB, includes a fastening device mounted upon the top surface of the PCB beside the electrical connector, and a back plate mounted upon the undersurface of the PCB and located between the PCB and a metallic case. The fastening device cooperates with the back plate to be secured to the PCB via a first set of fixing units. The case forms an opening/recessed region to receive a thickened central region of the back plate and is secured to the back plate via a second set of fixing units surrounding said opening. The thickened central region is fully received within the opening in the vertical direction. The first set of fixing units are located in the central region of the back plate while the second set of fixing units are located in a peripheral region of the back plate.

DETAILED DESCRIPTION OF THE PREFERRED EMBODIMENT

Figure 1:
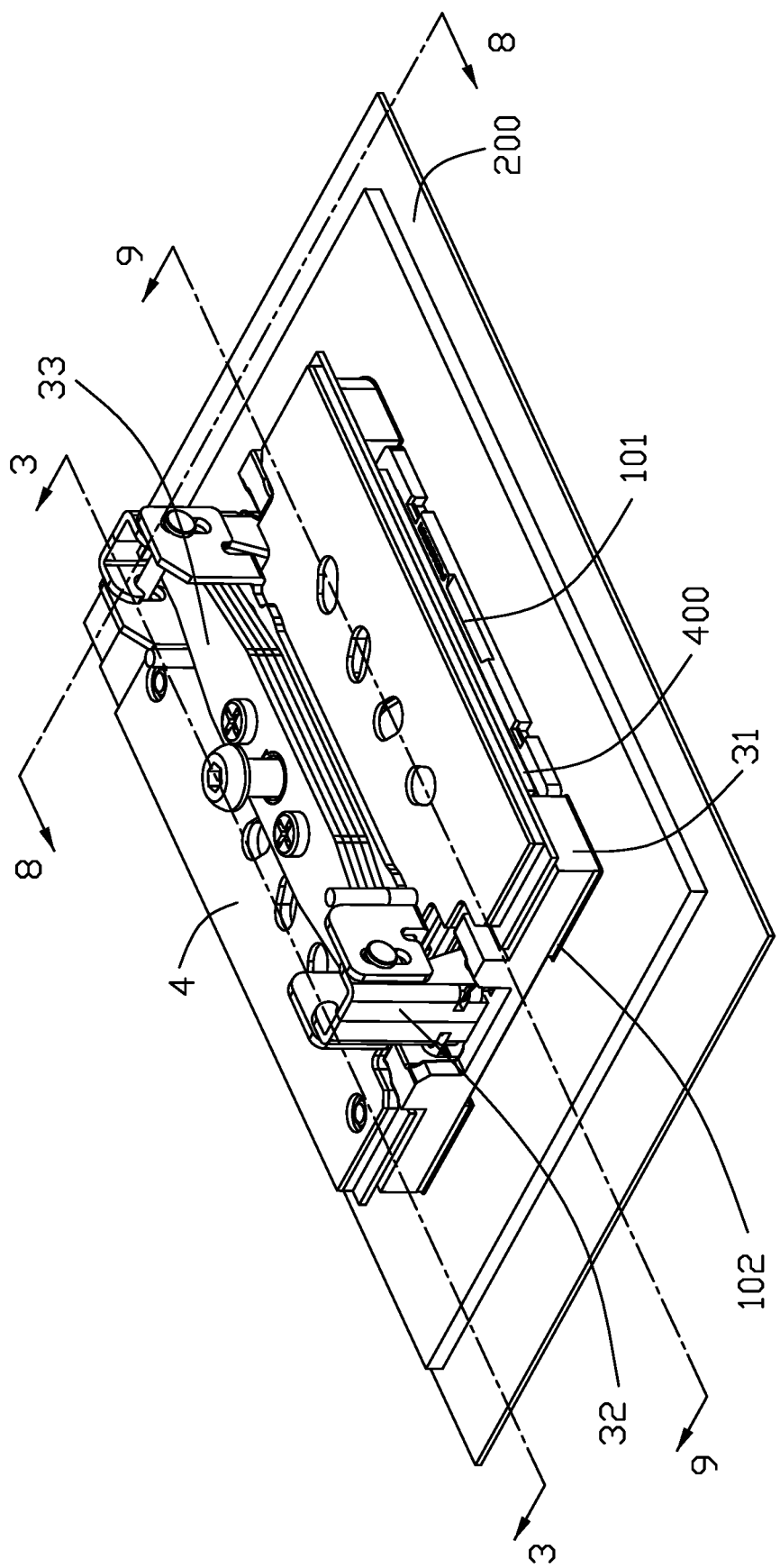
FIG. 1 is a perspective view of an assembly including the securing mechanism used with an electrical connector mounted upon the PCB according to the invention.
Figure 2:
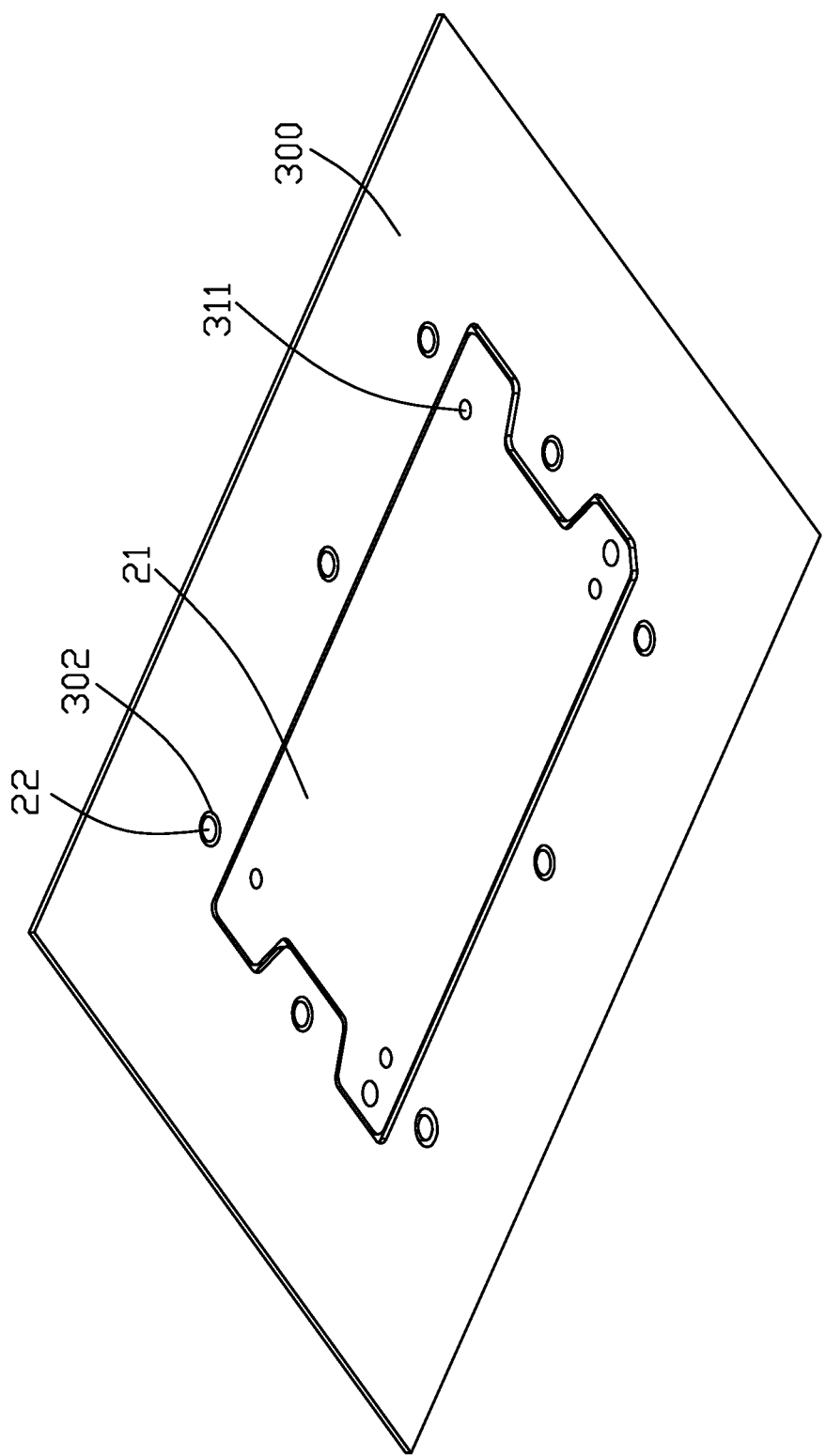
FIG. 2 is another perspective view of the electrical assembly of FIG. 1.
Figure 3:
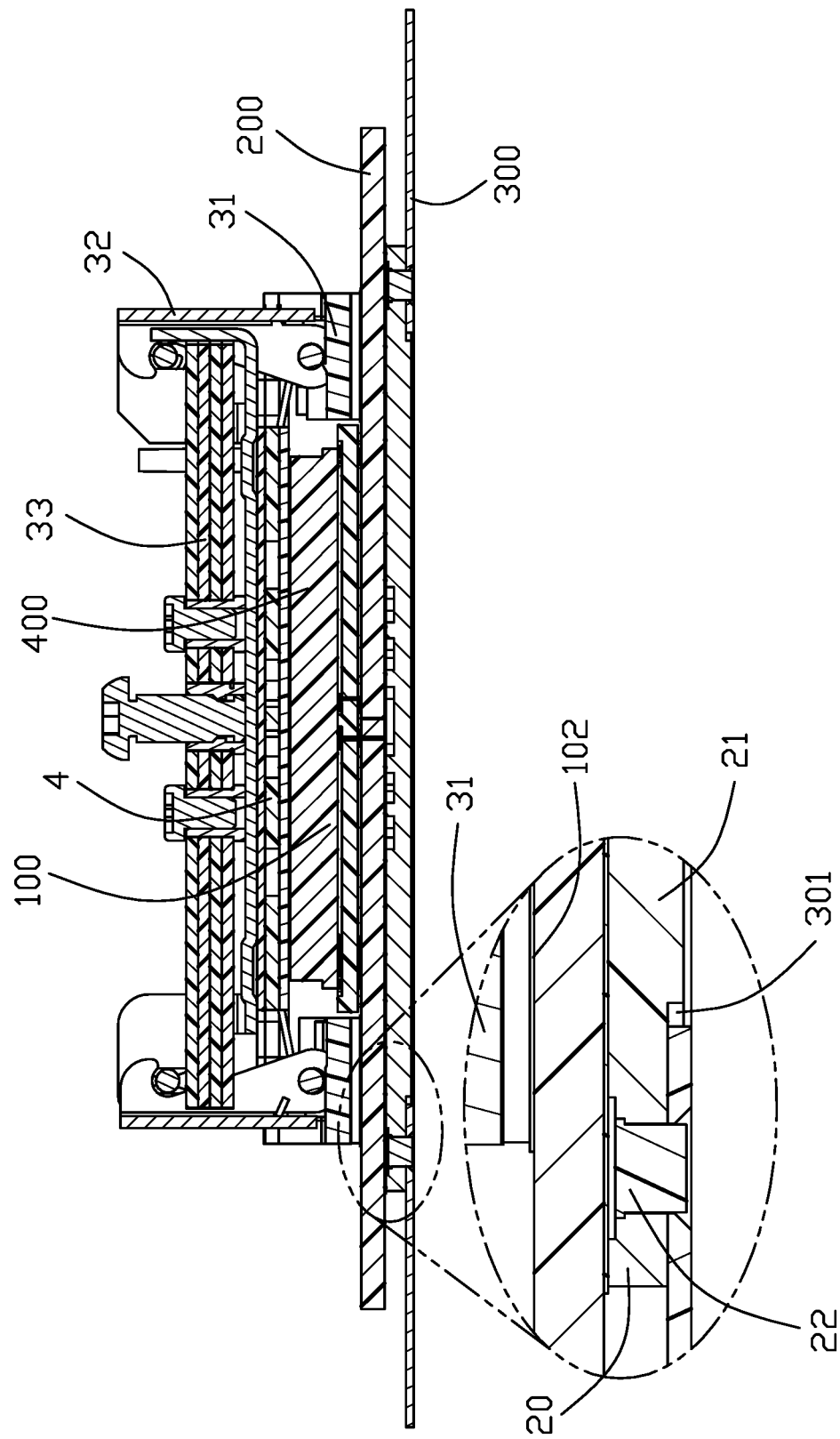
FIG. 3 is a cross-sectional view of the electrical assembly of FIG. 1 along line 3-3.
Figure 4:
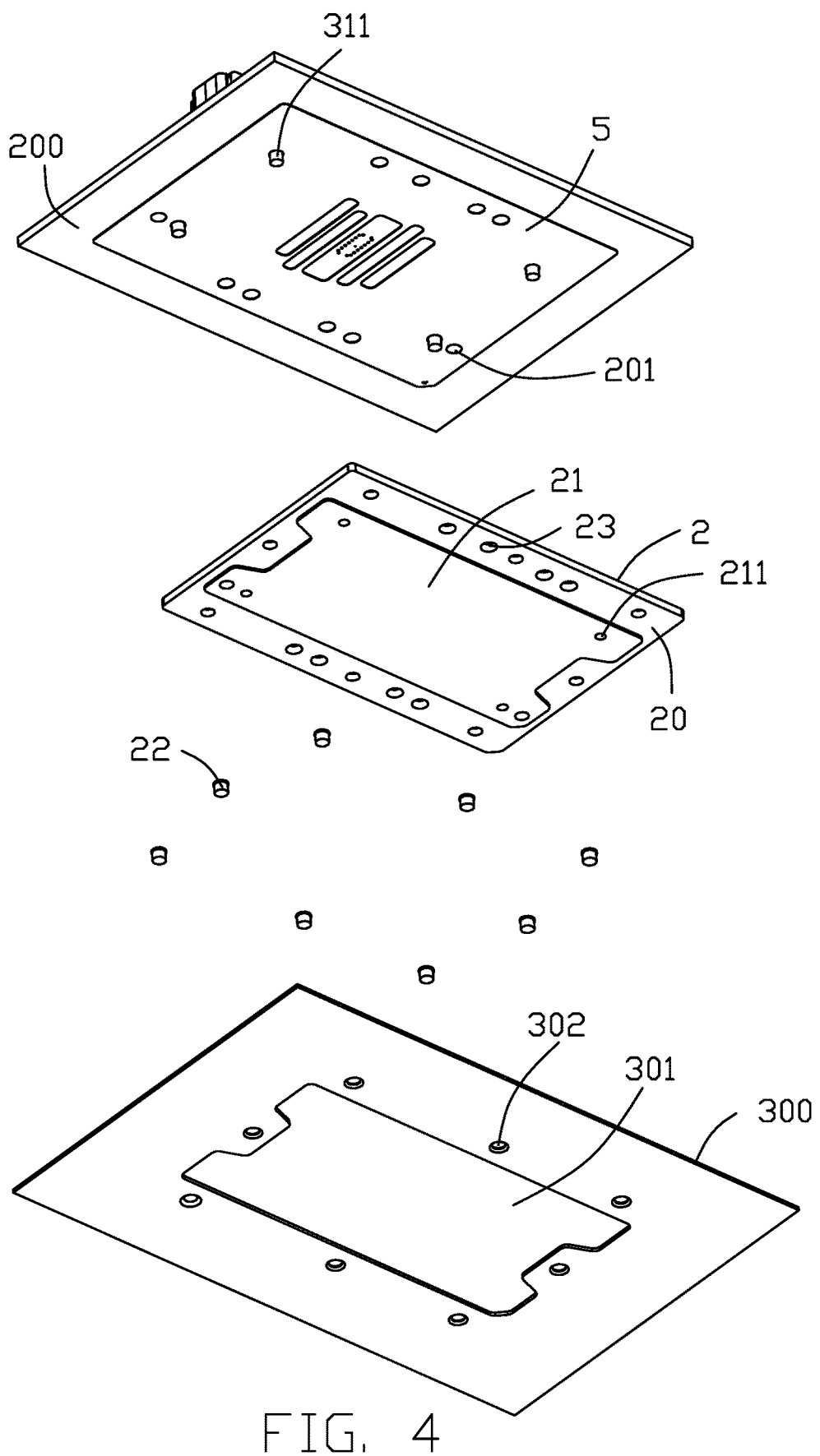
FIG. 4 is an exploded perspective view of the electrical assembly of FIG. 1.
Figure 5:
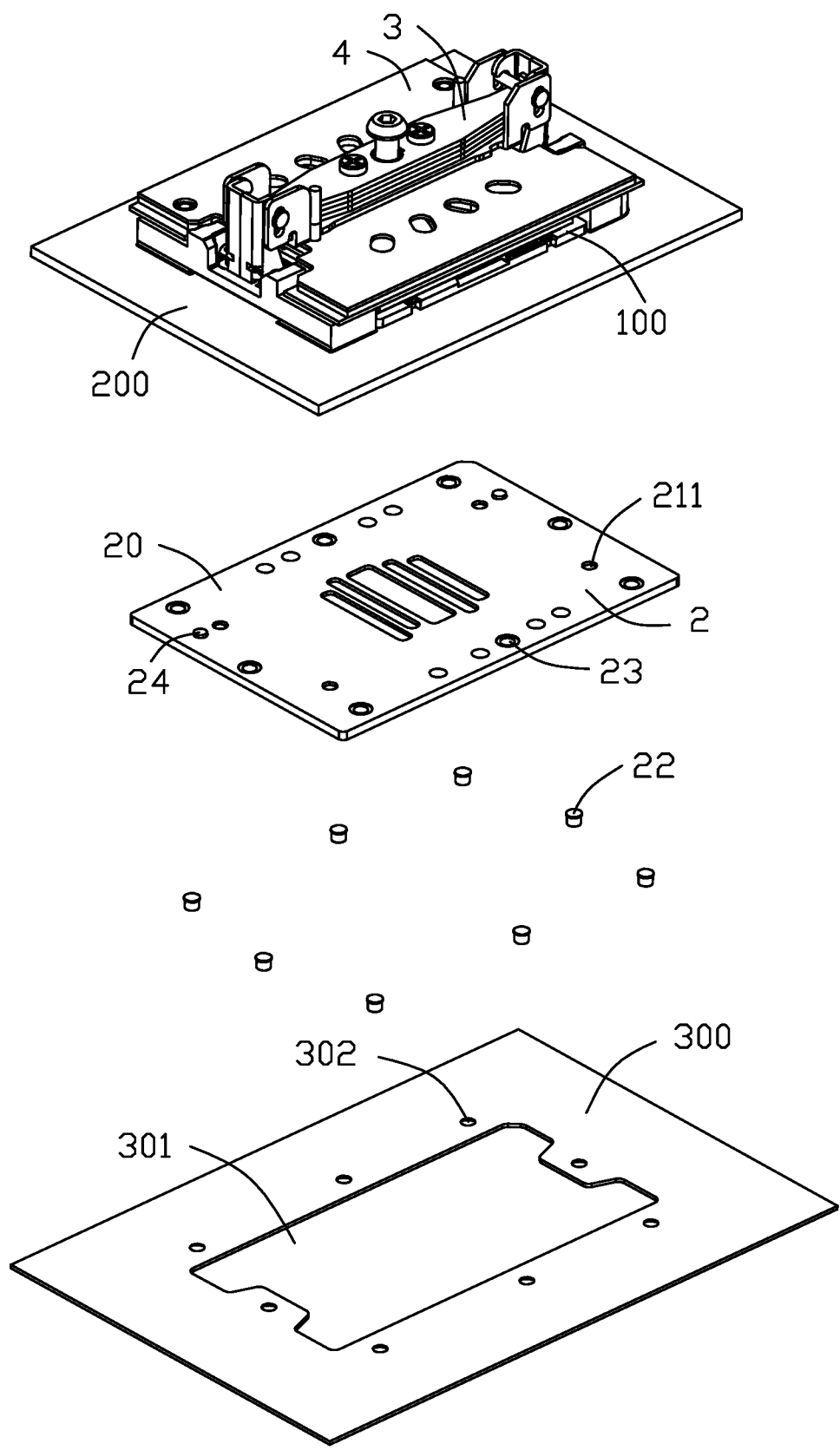
FIG. 5 is another exploded perspective view of the electrical assembly of FIG. 4.
Figure 6:
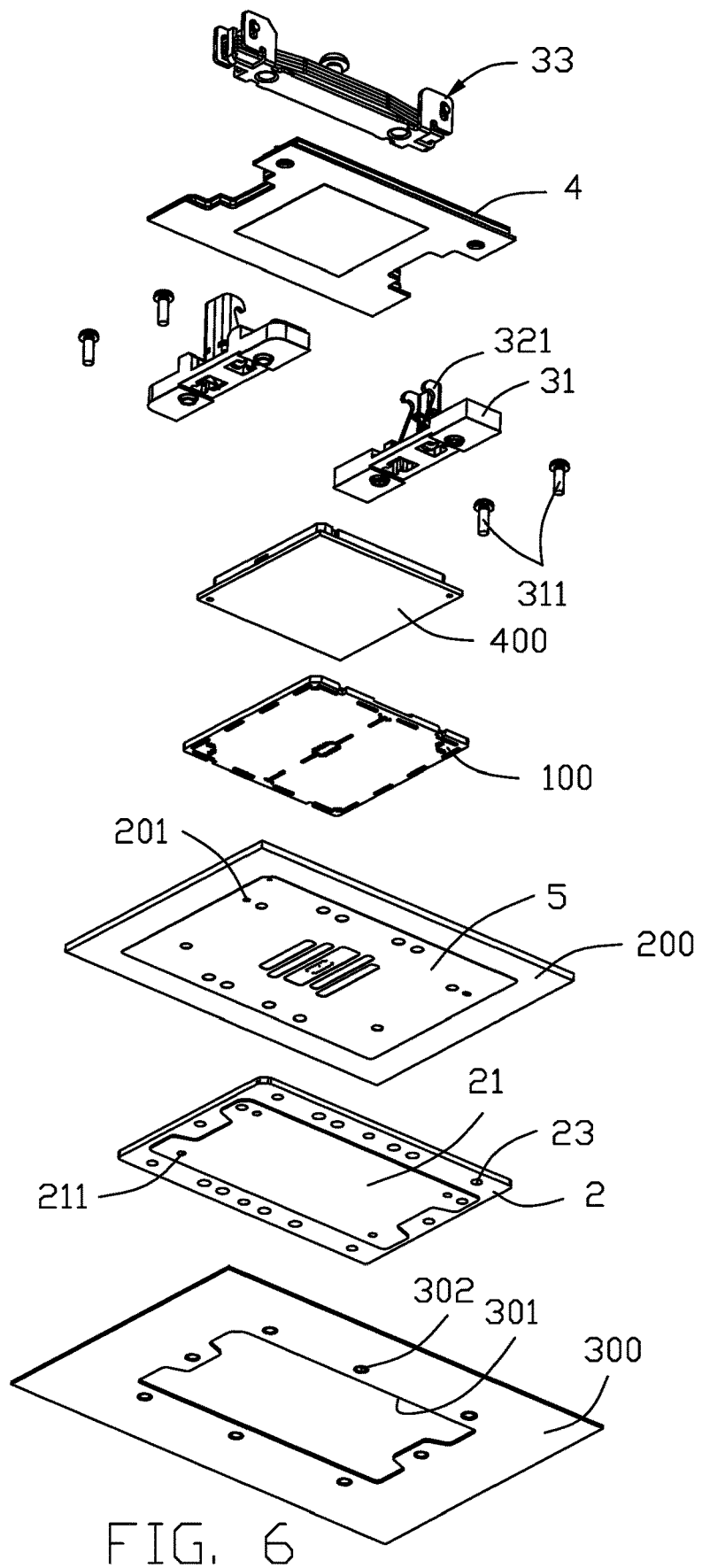
FIG. 6 is a further exploded perspective view of the electrical assembly of FIG. 4.
Figure 7:
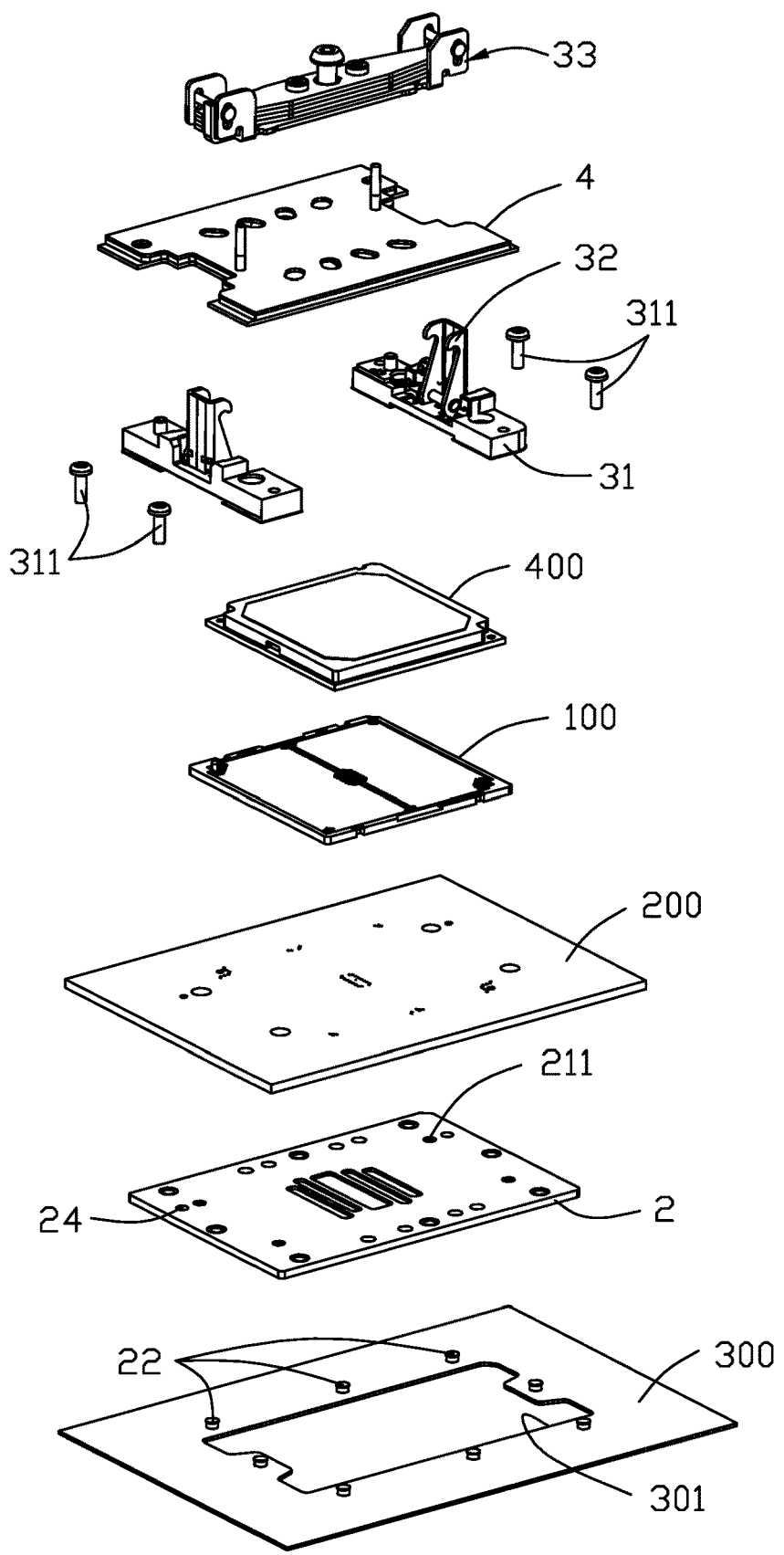
FIG. 7 is further exploded perspective view of the electrical assembly of FIG. 5.
Figure 8:
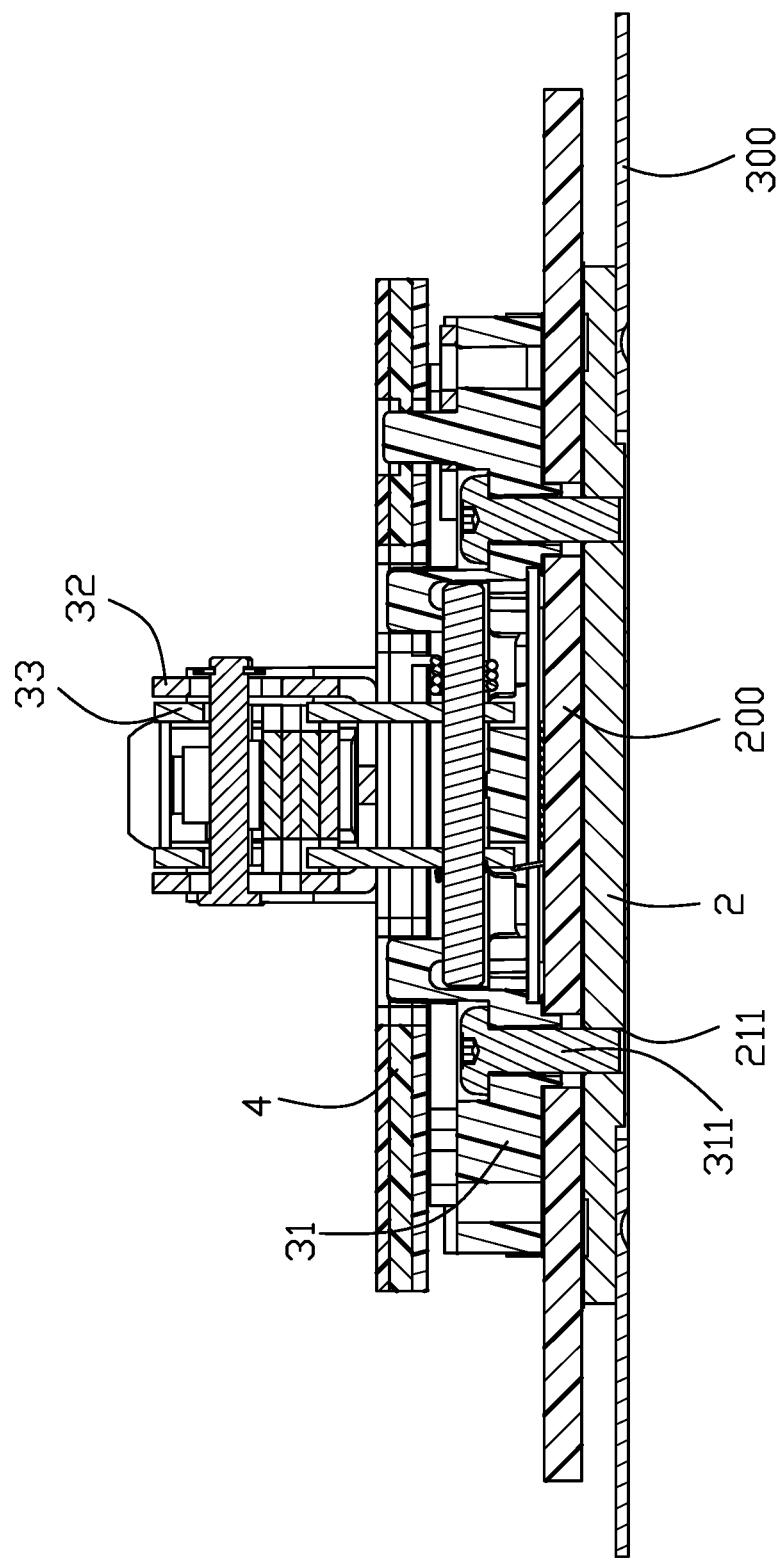
FIG. 8 is a cross-sectional view of the electrical assembly of FIG. 1 along line 8-8.
Figure 9:
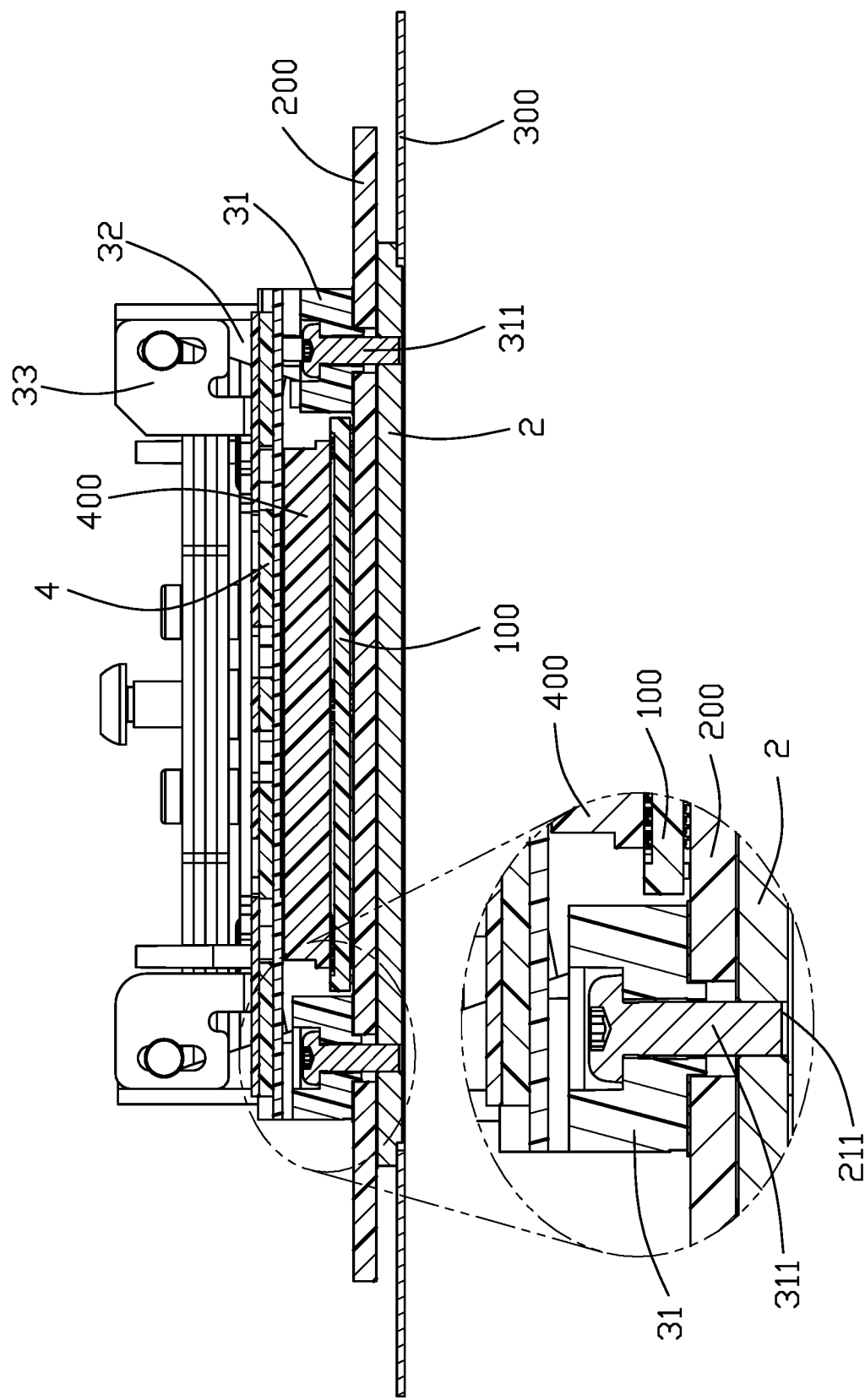
FIG. 9 is a cross-sectional view of the electrical assembly of FIG. 1 along line 9-9.

Referring to FIGS. 1-9, a securing mechanism for holding a CPU module 400 in the electrical connector 100 mounted upon a PCB 200, includes a metallic back plate 2 attached upon an undersurface of the PCB 200 with a metallic case 300 thereunder, and a fastening device 3 mounted upon an upper surface of the PCB 200 and beside the electrical connector 100. The fastening device 3 cooperating with the back plate 2 to sandwich the PCB 200 therebetween.

The fastening device 3, which can be referred to the copending application Ser. No. 16/260,137 with the same inventors, includes a pair of fastening pieces 31 located at two opposite end region of the electrical connector 100 in a front-to-back direction, a pair of connecting pieces 32 pivotally mounted upon the corresponding fastening pieces 31, respectively, and a metallic pressing piece 33 removably linked to the connecting pieces 32 at two opposite ends, so as to downwardly press a heat sink 4 against the CPU module 400. The electrical connector 100 includes an insulative housing 101 forming a CPU module receiving room (not labeled) for receiving the CPU module 400 therein and a plurality of contacts (not shown) disposed in the housing 101 to contact the CPU module 400. The securing piece 31 is fastened to the back plate 2 via the screws 311 extending through the PCB 200 therebetween. A gasket 32 is sandwiched between the fastening piece 31 and the PCB 200. Understandably, the gasket 102 includes corresponding holes for allowing the screws 31 to extend therethrough. An insulative film 5 is formed between the PCB 200 and the back plate 2.

The back plate 2 includes a main part 20 and a thickened part 21, and the case 300 forms a recessed region 301 to receive the thickened part 21 therein. The main part 20 forms a plurality of fastening holes 23. The thickened part 21 does not extend below the case 300, and the thickened part 21 is either downwardly exposed to an exterior if the recessed region is a through opening, or is hidden behind the case 300 if the recessed region is not a through opening but hidden behind the thinned wall of the case 300. A plurality of holes 302 are formed in the case 300 surrounding the recessed region 301. On one hand, a plurality of rivets 22 extend into the corresponding holes 302 of the case 300 and the corresponding holes 23 of the back plate 2 with the enlarged ends to secure both the case 300 and the back plate 2 together. On the other hand, as mentioned earlier, the screws 311 extend through the fastening piece 31, the gasket 102, the PCB 200, and the corresponding screw holes 211 of the back plate 2 to secure the fastening piece 31, the PCB 200 and the back plate 2 together. In other words, the invention uses the first set of fixing units, i.e., the screws 311, inside the recessed region 301 to secure the securing piece 31, the PCB 200 and the back plate 2 together, and uses the second set of fixing units, i.e., the rivets 22, outside of the recessed region 301 to secure the case 300 and the back plate 2 together. In addition, the PCB 200 further includes a plurality of alignment holes 201 to cooperate with the alignment posts 24 formed on the back plate 2 for precisely positioning the back plate 2 to the PCB 200.

The assembling way includes the following steps. The electrical connector 100 is mounted upon the top surface of the PCB 200, and the CPU module 400 is mounted upon the electrical connector 100, and the fastening device 3 is mounted upon the top surface of PCB 200 to have the heat sink 4 is securely sandwiched between the pressing piece 33 of the fastening device 3 and the CPU module 400 in the vertical direction. The back plate 2 and the case 300 are secured together via the rivets 22. The PCB 200 alone with the associated components on the top surface thereof, is precisely aligned with the back plate 2, which is associated with the case 300, via the alignment posts 24 on the back plate 2 and the alignment holes 204 of the PCB 200. The securing piece 31 is secured to the back plate 2 with the PCB 200 therebetween, via the screws 311.

The feature of the invention is to provide the stepped structure of the back plate for compromising the reduced distance or gap between the case and the back plate with the first set of fixing units, i.e., the screws 311, being used to secure the fastening device 3 and the back plate 2 together, and the second set of fixing units, i.e., the rivets 22, being used to secure the back plate 2 and the case 300 together, wherein on one hand, the screws 311 cooperate with the thickened part 21 of the back plate 2 to secure the tensioned fastening device 3 without jeopardizing the required strength, thus assuring reliability thereof. On the other hand, even though the main part 20 is thinner than the thickened part 21, it still keeps the desired strength because of the rivets 22 which secure the case 300 and the back plate 2 together.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical assembly comprising:
   a PCB (printed circuit board) forming opposite top surface and bottom surface in a vertical direction;
   an electrical connector mounted upon the top surface;
   a CPU (Central Processing Unit) located upon the electrical connector;
   a fastening device mounted upon the top surface beside the electrical connector to sandwich a heat sink between the fastening device and the CPU;
   a back plate positioned upon the bottom surface;
   a case intimately positioned under the back plate; wherein the back plate forms a thickened part and the case forms a recessed region to receive the thickened part therein.

2. The electrical assembly as claimed in claim 1, further including a first set of fixing units to secure the fastening device to the back plate.

3. The electrical assembly as claimed in claim 2, wherein said first set of fixing units are located within the recessed region.

4. The electrical assembly as claimed in claim 3, further including a second set of fixing units to securing the back plate and the case together.

5. The electrical assembly as claimed in claim 4, wherein said second set of fixing units are located outside of the recessed region in a surrounding manner.

6. The electrical assembly as claimed in claim 4, wherein said second set of fixing units are rivets.

7. The electrical assembly as claimed in claim 4, wherein the first set of fixing units extend through the PCB while the second set of fixing units do not extend through the PCB.

8. The electrical assembly as claimed in claim 2, wherein the first set of fixing units are screws.

9. The electrical assembly as claimed in claim 2, wherein the first set of fixing units extend through the thickened part.

10. The electrical assembly as claimed in claim 1, wherein the thickened part does not extend beyond the back plate downwardly.

11. The electrical assembly as claimed in claim 1, further including alignment devices on both the back plate and the bottom surface of the PCB.

12. The electrical assembly as claimed in claim 11, wherein the alignment devices are not located within the recessed region.

13. The electrical assembly as claimed in claim 1, wherein the thickened part is located on a middle portion of the back plate.

14. The electrical assembly as claimed in claim 1, wherein the fastening device includes a securing piece, a connecting piece and a pressing piece.

15. A metallic back plate for mounting to an undersurface of a PCB (printed circuit board) and use with a case having a recessed region, comprising:
    a thickened part adapted to be received within the recessed region and forming a plurality of screw holes for receiving corresponding screws to secure together the back plate and a fastening device which is adapted to be mounted upon an upper surface of the PCB; and
    a main part surrounding the thickened part and adapted to be located outside of the recessed region and forming a plurality of rivet holes for receiving rivets therein for securing the back plate and the case together.

16. The metallic back plate as claimed in claim 15, wherein the back plate further includes an alignment post for extending into a corresponding alignment hole in the PCB.

17. A method of making an assembly comprising steps of:
    providing a PCB (printed circuit board) with opposite top and bottom surfaces in a vertical direction;
    mounting an electrical connector upon the top surface;
    positioning a CPU (Central Processing Unit) upon the electrical connector;
    positioning a fastening device upon the top surface beside the electrical connector to downwardly press a heat sink against the CPU;
    providing a back plate with a peripheral main part and a center thickened part,
    providing a case with a recessed region to receive the center thickened part;
    further including a step of securing the back plate and the case together via a plurality of rivets in the peripheral main part.

18. The method as claimed in claim 17, further including a step of securing the fastening device to the back plate via a plurality of screws in the center thickened part before positioning the center thickened part within the recessed region.

19. The method as claimed in claim 18, further providing an alignment device on both the back plate and the PCB for precisely aligning the PCB with the back plate before securing the fastening device to the back plate.

* * * * *